United States Patent

Nesbitt et al.

[11] Patent Number: 5,200,694
[45] Date of Patent: Apr. 6, 1993

[54] HEAD ASSEMBLY FOR PRINTED CIRCUIT BOARD TEST FIXTURE

[75] Inventors: Robert J. Nesbitt; Bruce A. Seavey, both of North Attleboro, Mass.

[73] Assignee: TTI TesTron, Inc., Woonsocket, R.I.

[21] Appl. No.: 884,909

[22] Filed: May 18, 1992

[51] Int. Cl.⁵ .................. G01R 1/02; G01R 1/04
[52] U.S. Cl. .................. 324/158 F; 324/72.5; 324/158 P
[58] Field of Search ............ 34/242; 324/72.5, 158 P, 324/158 F; 439/42, 131; 269/21

[56] References Cited

U.S. PATENT DOCUMENTS

| | | | |
|---|---|---|---|
| 4,230,985 | 10/1980 | Matrone et al. | 324/158 F |
| 4,255,037 | 3/1981 | Meadows et al. | 34/242 |
| 4,344,033 | 8/1982 | Stowers et al. | 324/158 P |
| 4,352,061 | 9/1982 | Matrone | 439/42 |
| 4,573,009 | 2/1986 | Fowler et al. | 324/158 F |
| 4,667,155 | 5/1987 | Coiner et al. | 324/158 F |
| 4,694,245 | 9/1987 | Frommes | 324/158 F |
| 4,780,086 | 10/1988 | Jenner | 439/131 |
| 4,799,006 | 1/1989 | Strohochneider | 324/158 F |
| 4,841,231 | 6/1989 | Angelucci | 324/158 F |

Primary Examiner—Ernest F. Karlsen
Assistant Examiner—William J. Burns
Attorney, Agent, or Firm—Salter, Michaelson & Benson

[57] ABSTRACT

A head assembly for a vacuum actuated printed circuit board test fixture includes a top plate adapted for receiving a printed circuit board thereon, a probe plate having a plurality of spring-loaded contact probes thereon, and a support assembly for supporting the top plate in sealed relation above the probe plate. The support assembly includes a primary seal member having a channel formed therein and a resilient secondary seal member in the channel which cooperates with the primary seal member to provide a seal between the top plate and the probe plate around the entire perimeter of the top plate and to support the top plate so that it is movable toward the probe plate by resiliently compressing the secondary seal member.

11 Claims, 3 Drawing Sheets

HEAD ASSEMBLY FOR PRINTED CIRCUIT BOARD TEST FIXTURE

BACKGROUND AND SUMMARY OF THE INVENTION

The instant invention relates to test fixtures for testing printed circuit boards and more particularly to a head assembly for a vacuum actuated test fixture for testing printed circuit boards.

Vacuum actuated test fixtures have been found to be highly effective for testing many types of printed circuit boards. In this regard, vacuum actuated test fixtures are normally adapted for receiving printed circuit boards of predetermined configurations thereon, and for electrically connecting the printed circuit boards to test computers in order to electrically test the printed circuit boards prior to use. Most of the heretofore available test fixtures of this type have comprised a head assembly which includes an upper peripheral frame, a top plate received the frame, and a flexible diaphragm which extends in sealed relation between the top plate and the frame around the entire perimeter of the frame, so that the top plate is downwardly movable in sealed relation to the frame. A head assembly of this type is normally mounted in a test fixture, so that it is supported above a probe plate in the fixture having a plurality of spring-loaded electrical probes thereon. Accordingly, by evacuating the area between the top plate and the probe plate the top plate can be drawn downwardly toward the probe plate to electrically connect a printed circuit board received on the top plate with the probes on the probe plate. However, it has been found that in many instances the diaphragm of a head assembly of this type can become cracked and worn, and develop vacuum leaks after repeated use. Further, it has been found that the mounting structure, including the peripheral frame required for mounting a diaphragm and a top plate in a head assembly of this type can be relatively large and cumbersome. Accordingly, there is a recognized need for an improved head assembly for a test fixture which enables a top plate to be repeatedly drawn downwardly without eventually effecting the ability of the head assembly to maintain a vacuum in the area between the head assembly and the probe plate. It has also been found that there is a need for a head assembly of this type which can be constructed with a minimum of mounting and supporting structure for achieving a vacuum tight seal around the perimeter of a top plate.

The instant invention provides an improved head assembly for a vacuum actuated test fixture which enables a top plate to be more easily, effectively, and efficiently supported in a manner wherein the top plate is repeatedly movable toward a probe plate over a prolonged period of time without effecting the ability of the head assembly to maintain and hold a vacuum in the area between the top plate and the probe plate. Specifically, the head assembly of the instant invention comprises a top plate, a probe plate having a plurality of electrical probes thereon, and a support assembly for supporting the top plate in upwardly spaced relation to the probe plate and for sealing therebetween in a manner which nevertheless permits the top plate to be moved downwardly relative to the probe plate in order to effect electrical contact between the probes on the probe plate and the printed circuit board. The support assembly comprises a rigid peripheral support member which includes a substantially horizontally extending support wall which extends adjacent to the perimeter of the top plate in downwardly spaced relation thereto, and which is received in sealed relation on the probe plate. The support assembly further comprises a seal assembly between the top plate and the support wall for effecting an airtight seal therebetween. The seal assembly includes a primary seal member which is preferably made of a non-foam elastomer and received in sealed engagement with one of either the bottom side of the top plate or the top side of the support wall, and a resilient secondary seal member which is received in sealed engagement with the other of the bottom side of the top plate or the top side of the support wall. The primary seal member preferably has a channel formed therein and the secondary seal member is preferably received in the channel in the primary seal member so that the primary and secondary seal members cooperate for supporting the top plate on the support wall. The primary seal member is constructed so that it is normally maintained in spaced relation to the other of the bottom side of the top plate or the top side of the support wall by the secondary seal member. However, the secondary seal member is constructed so that it is resiliently compressible in order to draw the primary seal member into sealed engagement with both the bottom side of the top plate and the top side of the support wall. The secondary seal member is preferably received in engagement on top side of the support wall and the primary seal member is preferably supported on the secondary seal member so that it is normally maintained in spaced relation to the top side of the support wall. The primary seal member preferably comprises a non-foam elastomer, and the secondary seal member preferably comprises a resilient foam, such as polyurethane foam. The primary seal member preferably includes inner and outer portions which are disposed on opposite sides of the channel therein, and the inner and outer portions preferably both sealingly engage the other of the bottom side of the top plate or the top side of the support wall when the secondary seal member is compressed to draw the primary seal member into sealed engagement with both the bottom side of the top plate and the top side of the support wall. The support member preferably further includes an outer wall which extends upwardly from the support wall around the perimeter of the top plate and around the seal assembly. The support member preferably still further comprises an inner wall which extends upwardly from the support wall in inwardly spaced relation to the outer wall around the perimeter of the probe plate, and the inner and outer walls of the support member preferably cooperate with the support wall to define an upwardly opening channel for containing the seal assembly therein. Still further, the support member preferably includes an inner lip which extends inwardly from the inner wall and which is received in sealed engagement on the probe plate for securing the support member thereto. The seal member preferably further comprises a spacer portion which extends upwardly between the outer wall and the perimeter of the top plate in order to maintain the perimeter of the top plate in spaced relation to the outer wall.

It has been found that the head assembly of the instant invention can be effectively utilized for providing a compressible seal between the top plate and the probe plate of a printed circuit board test fixture. Specifically, it has been found that because the primary seal member is maintained in sealed engagement with one of either the top plate or the probe plate, and the secondary seal member is maintained in sealed engagement with the other of either the top plate or the probe plate, the seal assembly is operative for providing an effective seal between the top plate and the probe plate regardless of whether the secondary seal member is in a compressed or an uncompressed disposition. Further, when a vacuum is applied to the area between the top plate and the probe plate, the primary seal member is drawn into pressurized sealed engagement with both the top plate and the support wall to provide an even more effective airtight seal between the top plate and the probe plate. Still further, because the head assembly of the subject invention relies on the first and second seal members to effect a seal between the top plate and the probe plate rather than utilizing a flexible diaphragm, the head assembly of the subject invention is substantially more durable than the previously available seal assemblies. Even still further, because of the construction of the seal assembly of the instant invention the primary and secondary seal members can be readily and easily replaced if either is damaged.

Accordingly, it is a primary object of the instant invention to provide a head assembly for a printed circuit board test fixture which can withstand repeated use for a prolonged period of time.

Another object of the instant invention is to provide a head assembly for a printed circuit board test fixture which includes a readily replaceable and removable seal assembly.

An even still further object of the instant invention is to provide a seal assembly for a printed circuit board test fixture which includes a support member formed in the configuration of an upwardly-opening channel, and a seal assembly in the channel comprising an elastomeric primary seal member and a resilient foam secondary seal member, wherein the secondary seal member is resiliently compressible to enable the primary seal member to be drawn into pressurized sealed engagement with both the support member and the top plate of the test fixture.

Other objects, features and advantages of the invention shall become apparent as the description thereof proceeds when considered in connection with the accompanying illustrative drawings.

DESCRIPTION OF THE DRAWINGS

In the drawings which illustrate the best mode presently contemplated for carrying out the present invention.

DESCRIPTION OF THE INVENTION

Figure 1:
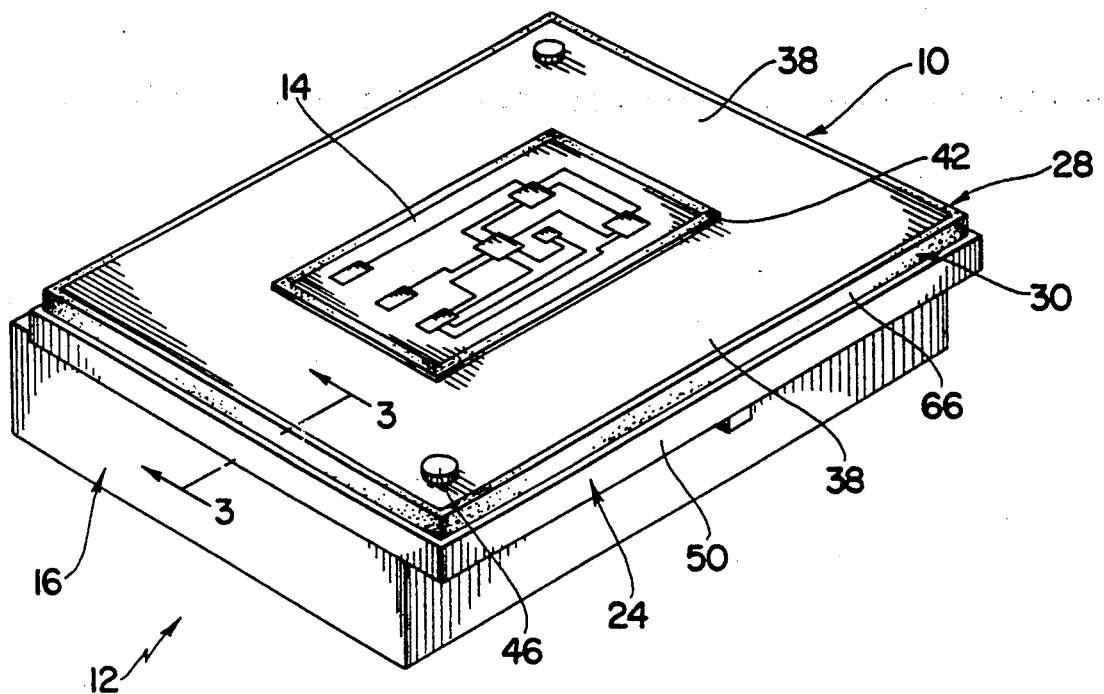
FIG. 1 is a perspective view of a test fixture which includes the assembly of the instant invention.

Referring now to the drawings, the head assembly of the instant invention is illustrated and generally indicated at 10 in FIG. 1. The head assembly 10 comprises part of a test fixture generally indicated at 12, and it is adapted for receiving a printed circuit board 14 in sealed engagement thereon. The test fixture 12 further comprises a base portion 16 which is adapted for supporting the head assembly 10 thereon and adapted to be received on a test computer, so that the head assembly 10 is electrically connected to the test computer to permit the computer to be utilized for electrically testing the printed circuit board 14.

The base 16 is formed in the configuration of an open box-like structure, and it includes a peripheral side wall portion 18 which is preferably made of a suitable sheet metal.

The head assembly 10 comprises a probe plate 20 having a plurality of electrical probes 22 thereon, a support frame 24, a top plate 26, and a seal assembly 28 comprising a primary seal 30 and a resilient secondary seal 32.

The probe plate 20 includes a plate portion 34 which is preferably constructed from a fiber reinforced plastic laminate, and which has a pair of sockets 36 located at diagonally opposite corners thereof. The contact probes 22 comprise conventional spring-loaded contact probes and they are disposed in a predetermined orientation on the plate portion 34, so that they are operative for contacting predetermined areas of the printed circuit board 14 in order to electrically connect the circuit board 14 to a test computer. The probe plate 20 is hingeably attached to the base 16, so that it is hingeable upwardly to provide access to the undersides of the spring probes 22 and the interior of the base 16.

The top plate 26 comprises a substantially flat, rectangular plate 38 having a centrally located nesting area 40 formed thereon. The plate 38 is preferably constructed from a non-conductive fiber reinforced plastic laminate, and the nesting area 40 is defined by an elastomeric peripheral seal 42 which is secured to the top plate 38 and operative for receiving the printed circuit board 14 in sealed relation thereon. The plate 38 has a plurality of apertures 44 formed therein in the nesting area 40, the apertures 44 being positioned for receiving the probes 22 therethrough as the top plate 26 is drawn downwardly toward the probe plate 20 in order to electrically connect the probes 22 with the circuit board 14. The probe plate 26 further comprises a pair of spring-loaded fastening elements 46 which are releasably securable in the sockets 36 for releasably retaining the top plate 26 in aligned relation with the probe plate 20 in a manner which nevertheless permits the top plate 26 to be drain downwardly toward the probe plate 20.

Figure 3:
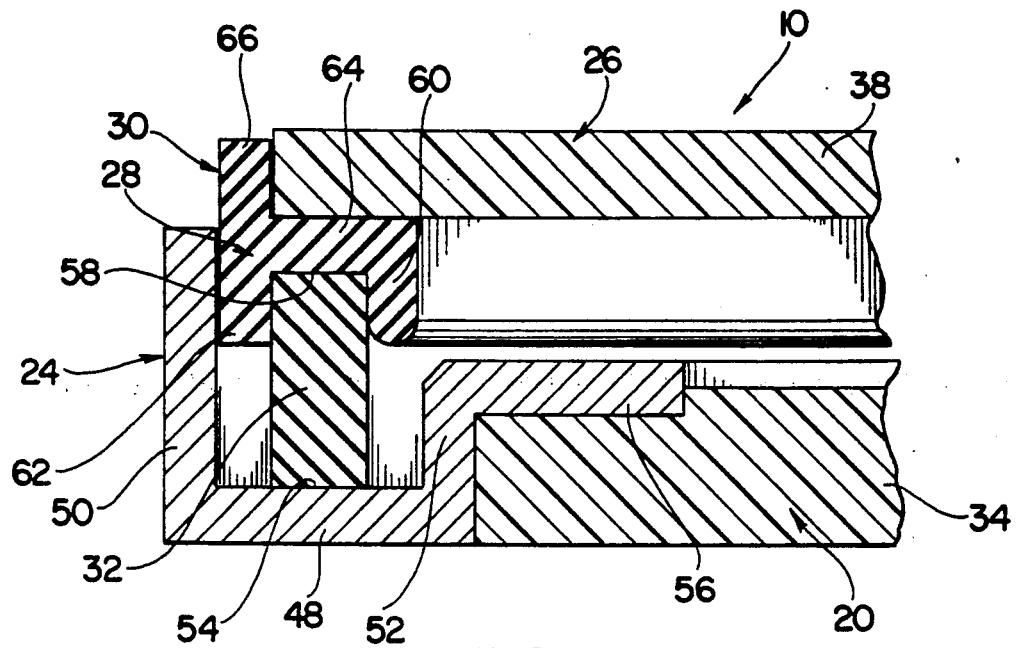
FIG. 3 is a sectional view taken along the line 3—3 in FIG. 1
Figure 4:
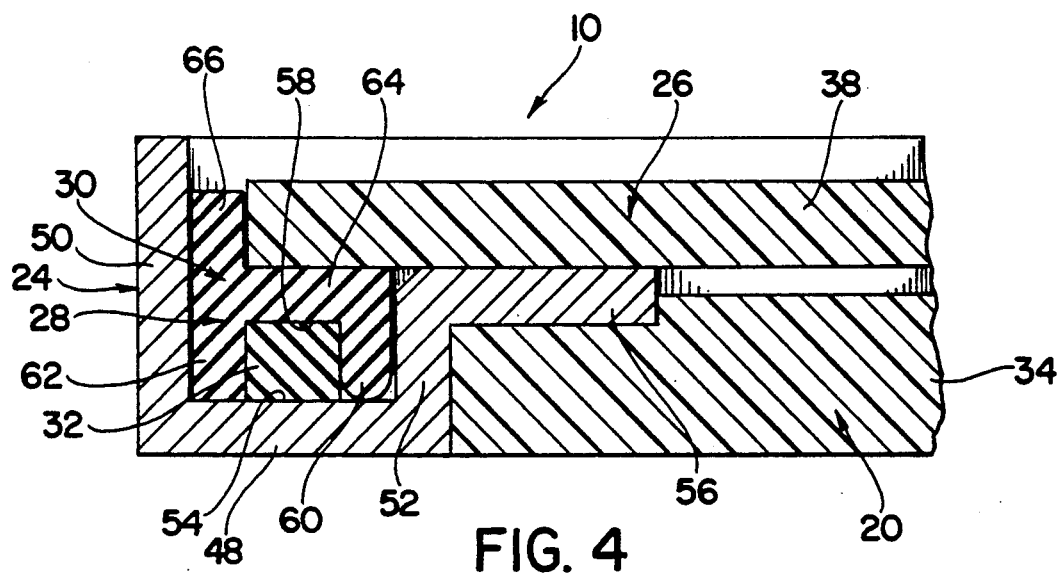
FIG. 4 is a similar sectional view with the top plate drawn downwardly toward the probe plate.

As illustrated most clearly in FIGS. 3 and 4, the top plate 26 is supported in upwardly spaced relation to the probe plate 20 with a supporting assembly comprising the support frame 24 and the seal assembly 28 which includes the primary seal 30 and the secondary seal 32. The support frame 24 is preferably formed from a substantially rigid metal, such as aluminum, and it includes a bottom or support wall 48, an outer wall 50 which extends upwardly from the support wall 48, and an inner wall 52 which extends upwardly from the support wall 48 in inwardly spaced relation to the outer wall 50. Accordingly, the support wall 48, the outer wall 50, and the inner wall 52 cooperate to define an upwardly opening channel 54 which extends around the perimeter of the probe plate 20. The support frame 24 further comprises an inner lip 56 which extends inwardly from the upper extremity of the inner wall 52. The support frame 24 is received and secured to the probe plate 20, so that the lip 56 extends inwardly a distance onto the plate portion 34, and so that the inner wall 52 abuts the outer perimeter of the plate portion 34. The probe plate 24 extends around the entire perimeter of the plate portion 34 as illustrated, and it is secured thereto in sealed relation.

The seal assembly 28 is received in the channel 54, and it is operative for supporting the top plate 26 so that it is downwardly movable in sealed relation to the support frame 24. The seal assembly 28 is formed in a continuous configuration, so that it extends along the entire extent of the channel 54. The primary seal member 30 is preferably constructed from a suitable non-foam elastomeric material, such as neoprene or butyl rubber. The primary seal member 30 is dimensioned so that it is vertically movable in the channel 54, and it has a downwardly opening channel 58 formed therein which separates spaced inner and outer portions 60 and 62, respectively, of the first seal member 30. The first seal member 30 further includes an upper portion 64 which extends between the inner and outer portions 60 and 62, respectively, and a spacer portion 66 which extends upwardly from the upper portion 64. The rectangular plate 38 is received and supported in sealing engagement on the upper portion 64, so that the spacer portion 66 extends upwardly along the outer perimeter edge of the plate 38 in order to maintain the plate 38 in properly aligned relation relative to the support frame 24. The secondary seal member 32 is of substantially rectangular cross-sectional configuration as illustrated in FIGS. 3 and 4, and it is received in the channel 58, so that it also extends entirely around the perimeter of the probe plate 20. The secondary seal member 32 is preferably made from a foamed elastomeric material, such as polyurethane, and it is constructed so that it is downwardly compressible from the configuration illustrated in FIG. 3 to the configuration illustrated in FIG. 4. The bottom surface of the secondary seal member 32 is received in sealing engagement with the support wall 48, and the resilient second seal member 32 is constructed so that is compressible to a position, wherein the bottom ends of the inner and outer portions 60 and 62, respectively, are received in sealing engagement with the support wall 48 on opposite sides of the secondary seal member 32, as illustrated in FIG. 4. The primary and secondary seal members 30 and 32, respectively, are further constructed, so that when the secondary seal member 32 is in the first or non-compressed position thereof illustrated in FIG. 3, the probes 22 are spaced downwardly from the printed circuit board 14, and so that when the secondary seal member 32 is in the compressed disposition thereof illustrated in FIG. 4, the spring probes 22 extend through the apertures 44 and are received in resiliently biased engagement with predetermined areas of the printed circuit board 14.

Figure 2:
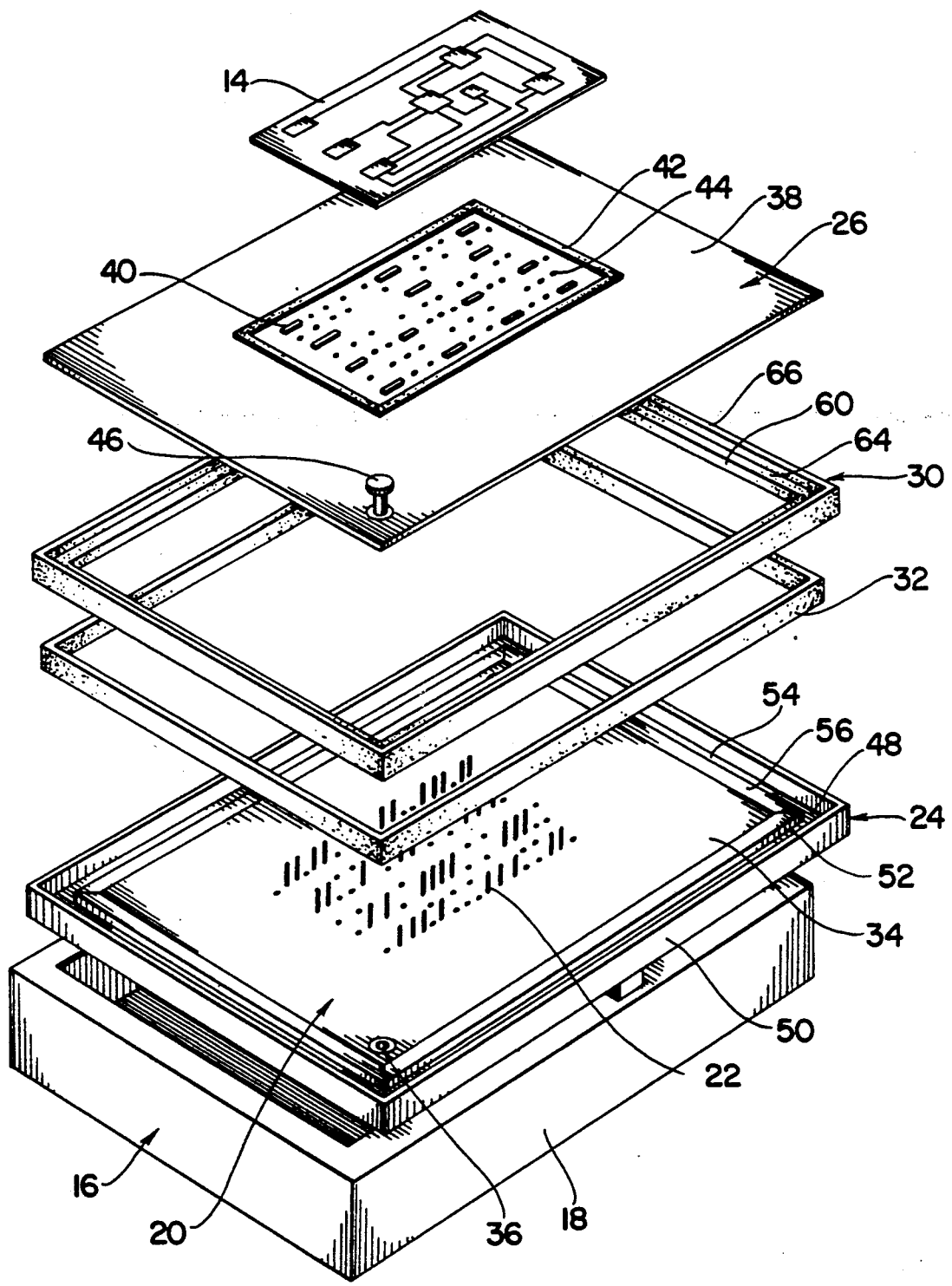
FIG. 2 is an exploded perspective view thereof.

Accordingly, for use and operation of the head assembly 10, the head assembly 10 is assembled with the base portion 16 in the manner illustrated in FIGS. 1 and 2, and a printed circuit board 14 is assembled in the nest area 40, so that it is received in sealing engagement on the seal 42. A vacuum is then applied to the test fixture 12 in a conventional manner to draw the top plate 26 downwardly, so that the spring probes 22 pass upwardly through the apertures 44 to make electrical contact with the printed circuit board 14. In this regard, prior to applying vacuum to the area between the top plate 26 and the probe plate 20, the seal assembly 28 is operative for effectively sealing between the top plate 26 and the support frame 24 where the upper portion 64 of the primary seal 30 contacts the top plate element 38 and where the secondary seal member 3 contacts the support wall 48, so that a vacuum can be effectively applied to the area between the top plate 26 and the probe plate 20 in order to draw the top plate 26 downwardly. Further, once the top plate 26 has been drawn downwardly to the position illustrated in FIG. 4, the inner and outer portions 60 and 62 of the primary seal member 30 also contact the support wall 48 to increase the seal area for sealing between the seal assembly 28 and the support frame 24. Once the printed circuit board 14 has been effectively tested in this manner the vacuum can be released, so that the head assembly is resiliently returned to its original position, and a new printed circuit board 14 can be assembled in the nest area 40 for testing the new circuit board 14 in a similar manner. Further, it has been found that the seal assembly 28 can withstand repeated use over a prolonged period of time without sustaining damage thereto. In any event, both the primary seal 30 and the secondary seal 32 can be quickly and easily replaced.

It is seen therefore that the instant invention provides an effective head assembly for a vacuum operated printed circuit board test fixture. The seal assembly 28 provides an effective seal between the top plate 26 and the probe plate 20, and it also provides an effective means for supporting the top plate 26 above the probe plate 20. Hence, it is seen that the head assembly of the subject invention represents a significant improvement in the art which has substantial commercial merit.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed:

1. In a head assembly for a vacuum actuated test fixture for a printed circuit board including a top plate having top and bottom sides and a perimeter, said top plate being adapted for receiving said printed circuit board in sealed relation thereon, a probe plate having a perimeter and having a plurality of test probes thereon, and support means for supporting said top plate in upwardly spaced relation to said probe plate and for sealing between said top plate and said probe plate so that said top plate is nevertheless downwardly movable toward said probe plate for effecting electrical contact between said test probes and said printed circuit board, the improvement comprising said support means comprising a rigid peripheral support member including a substantially horizontally extending support wall extending adjacent the perimeter of said top plate in downwardly spaced relation thereto, said support wall having a top side and being received in sealed relation on said probe plate, and resilient seal means between said top plate and said support wall extending along the perimeter of said top plate, said resilient seal means including a primary seal member received in sealed engagement with one of either the bottom side of said top plate or the top side of said support wall, and a resilient secondary seal member received in sealed engagement with the other of the bottom side of said top plate or the top side of said support wall, said primary and secondary seal members being positioned one atop the other and cooperating for supporting said top plate on said support wall, said primary seal member normally being maintained in spaced relation to said other of the bottom side of said top plate or the top side of said support wall by said secondary seal member, said secondary seal member being resiliently compressible to draw said primary seal member into sealed engagement with both the bottom side of said top plate and the top side of said support wall.

2. In the head assembly of claim 1, said primary seal member having a channel formed therein which opens toward said other of the bottom side of said top plate or the top side of said support wall, said secondary seal member being received in said channel.

3. In the head assembly of claim 1, said primary seal member normally engaging the bottom side of said top plate and normally being maintained in spaced relation to the top side of said bottom plate by said secondary seal member.

4. In the head assembly of claim 1, said secondary seal member comprising a resilient foam.

5. In the head assembly of claim 4, said primary seal member comprising a non-foam elastomer.

6. In the head assembly of claim 2, said primary seal member including inner and outer portions on the inner and outer sides of said channel, respectively, said inner and outer portions both sealingly engaging said other of the bottom side of said top plate or the top side of said support wall when said secondary seal member is compressed to draw said primary seal member into sealed engagement with both the bottom side of said top plate and the top side of said support wall.

7. In the head assembly of claim 1, said support member further comprising an outer wall extending upwardly from said support wall around the perimeter of said top plate and around said seal means.

8. In the head assembly of claim 7, said support member further comprising an inner wall extending upwardly from said support wall in inwardly spaced relation to said outer wall around the perimeter of said probe plate, said inner wall cooperating with said outer wall and said support wall to define an upwardly opening channel, said seal means being received in said upwardly opening channel.

9. In the head assembly of claim 8, said support member further comprising an inner lip extending inwardly from said inner wall, said inner lip being received in sealed engagement on said probe plate.

10. In the head assembly of claim 1, said primary seal member being received atop said secondary seal member, said primary seal member normally engaging said top plate and normally being spaced from said support wall when said secondary seal member is in an uncompressed disposition.

11. In the head assembly of claim 10, said outer wall extending around the perimeter of said top plate in outwardly spaced relation thereto, said primary seal member further comprising a spacer portion extending around the perimeter of said top plate between said top plate and said outer wall.

* * * * *